(12) United States Patent
Arsovski et al.

(10) Patent No.: US 8,848,414 B2
(45) Date of Patent: Sep. 30, 2014

(54) MEMORY SYSTEM INCORPORATING A CIRCUIT TO GENERATE A DELAY SIGNAL AND AN ASSOCIATED METHOD OF OPERATING A MEMORY SYSTEM

(71) Applicant: International Business Machines Corporation, Armonk, NY (US)

(72) Inventors: Igor Arsovski, Williston, VT (US); Daniel A. Dobson, Rochester, MN (US); Travis R. Hebig, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 109 days.

(21) Appl. No.: 13/656,829

(22) Filed: Oct. 22, 2012

(65) Prior Publication Data

US 2014/0112045 A1   Apr. 24, 2014

(51) Int. Cl.
*G11C 15/04* (2006.01)

(52) U.S. Cl.
USPC ............... 365/49.17; 365/194; 365/185.17; 365/156; 365/189.011

(58) Field of Classification Search
USPC ........... 365/49.17, 194, 185.17, 156, 189.011
See application file for complete search history.

(56) References Cited

U.S. PATENT DOCUMENTS

| | | | |
|---|---|---|---|
| 5,596,539 A | 1/1997 | Passow et al. | |
| 5,999,482 A | 12/1999 | Kornachuk et al. | |
| 7,103,791 B2 | 9/2006 | Lin | |
| 7,466,582 B2 | 12/2008 | Fifield et al. | |
| 7,979,832 B2 | 7/2011 | Jung et al. | |
| 8,228,713 B2 | 7/2012 | Arsovski et al. | |
| 8,233,337 B2 | 7/2012 | Arsovski et al. | |
| 2006/0050573 A1* | 3/2006 | Kim et al. | 365/194 |
| 2007/0047331 A1* | 3/2007 | Lee | 365/189.09 |
| 2008/0094902 A1* | 4/2008 | Lee | 365/185.17 |
| 2008/0205183 A1 | 8/2008 | Hwang et al. | |
| 2009/0024790 A1 | 1/2009 | Rajan et al. | |
| 2009/0027990 A1 | 1/2009 | Houston | |
| 2010/0027322 A1* | 2/2010 | Yamaoka et al. | 365/156 |
| 2010/0118621 A1 | 5/2010 | Adams et al. | |
| 2010/0265758 A1 | 10/2010 | Dray et al. | |
| 2012/0075918 A1 | 3/2012 | Arsovski et al. | |

OTHER PUBLICATIONS

O'uchi, et al., "0.5V FinFET SRAM with Dynamic Threshold Control of Pass Gates for Salvaging Malfunctioned Bits," 2010 Proceedings of the ESSCIRC, Sep. 2010, pp. 474-477.

(Continued)

*Primary Examiner* — Richard Elms
*Assistant Examiner* — Mohammed A Bashar
(74) *Attorney, Agent, or Firm* — Gibb & Riley, LLC; David A. Cain

(57) ABSTRACT

Disclosed are a memory system and an associated operating method. In the system, a first memory array comprises first memory cells requiring a range of time delays between wordline activating and bitline sensing. A delay signal generator delays an input signal by a selected time delay (i.e., a long time delay corresponding to statistically slow memory cells) and outputs a delay signal for read operation timing to ensure read functionality for statistically slow and faster memory cells. To accomplish this, the delay signal generator comprises a second memory array having second memory cells with the same design as the first memory cells. Transistors within the second memory cells are controlled by a lower gate voltage than transistors within the first memory cells in order to mimic the effect of higher threshold voltages, which result in longer time delays and which can be associated with the statistically slow first memory cells.

25 Claims, 9 Drawing Sheets

(56) References Cited

OTHER PUBLICATIONS

Carlson, et al., "Compensation of Systematic Variations through Optimal Biasing of SRAM Wordlines," Custom Integrated Circuits Conference (CICC), Sep. 2008, pp. 411-414.

Disclosed Anonymously, "CHINA—An Apparatus of a Novel Sense Amplifier Self-Margin Detection Logic to Reduce SRAM Dynamic Power," IP.com Prior Art Database, IP.com No. IPCOM000206932D, May 13, 2011, 9 pages.

Pilo, et al., "A 64Mb SRAM in 32nm High-k Metal-Gate SOI Technology with 0.7V Operation Enabled by Stability, Write-Ability and Read-Ability Enhancements," ISSCC 2011, Session 14, High-Performance Embedded Memory, 14.1, 2011 IEEE International Solid-State Circuits Conference, Feb. 22, 2011, pp. 254-256.

Braceras, et al., U.S. Appl. No. 13/307,245, filed Nov. 30, 2011.

Chen, et al., "A Dense 45nm Half-differential SRAM with Lower Minimum Operating Voltage," Circuits and Systems (ISCAS), 2011 IEEE International Symposium on, May 15-18, 2011, p. 57-60.

* cited by examiner ly, to a memory system incorporating a circuit for generating a delay signal to be used in read operation timing (e.g., wordline pulse timing and/or sense amplifier set signal timing) and an associated method of operating such a memory system.

2. Description of the Related Art

As mentioned above, memory systems generally comprise an array of essentially identical memory cells (e.g., static random access memory (SRAM) cells, ternary content-addressable memory (TCAM) cells, dynamic random access memory (DRAM) cells, non-volatile random access memory (NVRAM) cells, etc.) that store data values. Depending upon the type of memory cell, different steps may be performed during read operations to determine the stored data values. However, regardless of the type of memory cell, a read operation typically involves the activation of a wordline and, thereby the turning on of at least one access transistor (also referred to herein as a pass gate transistor) for a memory cell followed by the subsequent sensing by a sense amplifier of a charge on at least one bitline connected to the memory cell. For read operation accuracy (i.e., read operation stability), the timing of both the wordline pulse that activates the wordline and the sense amplifier set signal that activates the sense amplifier are critical to ensure that there is a sufficient amount of time delay between when the wordline is activated and when the sense amplifier senses the charge on the bitline(s) to ensure that the stored data value is properly read.

Wordline pulse timing and sense amplifier set signal timing are typically provided by a delay signal output by a delay signal generator. Historically, such delay signal generators incorporate logic devices to output a delay signal with some preset amount of time delay and this preset amount of delay is calculated based on the design of the memory cell. However, manufacturing process variations, temperature variations and/or voltage variations can result in a memory array with memory cells having a relatively large range of required time delays between wordline activating and sense amplifier sensing, particularly as memory cell sizes continue to be scaled. Therefore, recently, delay signal generators have been developed that generate a delay signal having a time delay which tracks the average time delay required by the memory cells. While such tracking delay signal generators provide for greater read operation stability over fixed delay signal generators that simply provide a delay signal with a preset amount of delay, they do not guarantee the read functionality of statistically slow memory cells.

SUMMARY

In view of the foregoing, disclosed herein are embodiments of a memory system and an associated operating method. In the memory system, a memory array comprises first memory cells requiring a range of corresponding time delays between wordline activating and bitline sensing for read functionality during a read operation. Thus, in the memory system, a delay signal generator delays an input signal by a selected time delay and, particularly, by a relatively long time delay corresponding to statistically slow memory cells and outputs a delay signal for use in wordline pulse and/or sense amplifier set signal timing. By generating a delay signal that tracks the time delay associated with statistically slow memory cells, the memory system provides for read functionality even in the presence of such slow memory cells. To accomplish this, the delay signal generator can, for example, comprise another memory array with second memory cells having the same design as the first memory cells. However, transistors within the second memory cells are controlled by a lower gate voltage than transistors within the first memory cells in order to mimic the effect of higher threshold voltages, which result in longer time delays and which can be associated with the statistically slow first memory cells. Thus, the embodiments allow for indirect tracking of the time delays of such statistically slow first memory cells.

More particularly, in each of the embodiments disclosed herein, the memory system can comprise a memory array (i.e., a functional memory array, also referred to herein as a first memory array) and this first memory array can comprise a plurality of first memory cells. Each first memory cell comprises a least one transistor (i.e., a first transistor) that is controlled by a first gate voltage. Each first memory cell requires a corresponding time delay between wordline activating and bitline sensing for read functionality during a read operation. However, due to manufacturing process variations, temperature variations and/or voltage variations, the first memory cells have different performance characteristics and, thereby require a range of different corresponding time delays between the wordline activating and the bitline sensing. This range can extend from relatively long time delays corresponding to statistically slow memory cells to relatively short time delays corresponding to statistically fast memory cells.

In each of the embodiments disclosed herein, the memory system can further comprise a delay signal generator that receives an input signal and delays the input signal in order to generate and output a delay signal for read operation timing (i.e., for wordline pulse timing and/or sense amplifier set signal timing) for the first memory cells in the first memory array. Specifically, this delay signal generator can delay the input signal by a selected time delay that is within the long time delays associated with statistically slow memory cells so as to provide read functionality even for such slow memory cells (e.g., by a selected time delay that is associated with $2\sigma$, $3\sigma$ or $4\sigma$ slow memory cells in order to provide read functionality for $2\sigma$, $3\sigma$ or $4\sigma$ (as applicable) slow and faster memory cells).

To accomplish this, the delay signal generator can, for example, comprise another memory array (i.e., a reference memory array, also referred to herein as a second memory array), which mimics the first memory array, and a reference voltage generator. The second memory array can comprise a plurality of second memory cells having the same design as the first memory cells such that the second memory cells similarly require the range of different corresponding time delays between wordline activating and bitline sensing for read functionality during a read operation. Like the first memory cells, the second memory cells can each comprise at least one transistor (i.e., at least one second transistor); however, the second transistor(s) of the second memory cells can be controlled by a second gate voltage, which is generated and output by the reference voltage generator and which is less than the first gate voltage that controls the first transistor(s) of the first memory cells so that ultimately the input signal is delayed by the selected time delay.

In one embodiment of the memory system, this reference voltage generator can comprise a fixed reference voltage generator that generates and, at an output node, outputs a predetermined second gate voltage, which is less than the first gate voltage such that ultimately the input signal is delayed by the selected time delay. In other embodiments of the memory system, the reference voltage generator can comprise a variable reference voltage generator that generates and, at an output node, outputs a selected one of multiple possible second gate voltages. The multiple possible second gate voltages can each be less than the first gate voltage and the selected one of the multiple possible second gate voltages can be preselected so that the input signal is ultimately delayed by the selected time delay. For example, one possible second gate voltage can be selected so that the input signal is delayed by a selected time delay corresponding to the time delay associated with 2σ slow memory cells, another possible second gate voltage can be selected so that the input signals delayed by a selected time delay corresponding to the time delay associated with 3σ slow memory cells, another possible second gate voltage can be selected so that the input signal is delayed by a selected time delay corresponding to the time delay associated with 4σ slow memory cells, and so on.

In any case, controlling the second transistor(s) within the second memory cells using a lower gate voltage than that used for controlling the first transistor(s) within the first memory cells has essentially the same effect as (i.e., mimics the effect of) increasing threshold voltage without changing current characteristics. Specifically, like increasing threshold voltage, decreasing the gate voltage results in longer time delays. Thus, the lower gate voltage can be used to increase the corresponding time delays of the second memory cells and the increased time delays can be associated with the longer time delays of statistically slow (i.e., 2σ, 3σ or 4σ slow) first memory cells with relatively high threshold voltages. Thus, the embodiments allow for indirect tracking of the longer time delays associated with such statistically slow first memory cells.

Also disclosed herein are embodiments of an associated method of operating a memory system, such as that described in detail above. The process steps of the method embodiments can be performed by the delay signal generator of that memory system and can comprise receiving an input signal, delaying the input signal so as to generate a delay signal, and outputting the delay signal for read operation timing (e.g., wordline pulse timing and/or sense amplifier set signal timing) within the memory system. The process step of delaying the input signal can specifically be performed by the delay signal generator such that the input signal is delayed by a selected time delay and such that this selected time delay is within the relatively long time delays associated with statistically slow memory cells so as to provide read functionality even for such slow memory cells. For example, the selected time delay can be a time delay associated with 2σ, 3σ or 4σ slow memory cells in order to provide read functionality for 2σ, 3σ or 4σ (as applicable) slow and faster memory cells.

BRIEF DESCRIPTION OF THE DRAWINGS

The embodiments herein will be better understood from the following detailed description with second to the drawings, which are not necessarily drawn to scale and in which.

DETAILED DESCRIPTION

Figure 1:
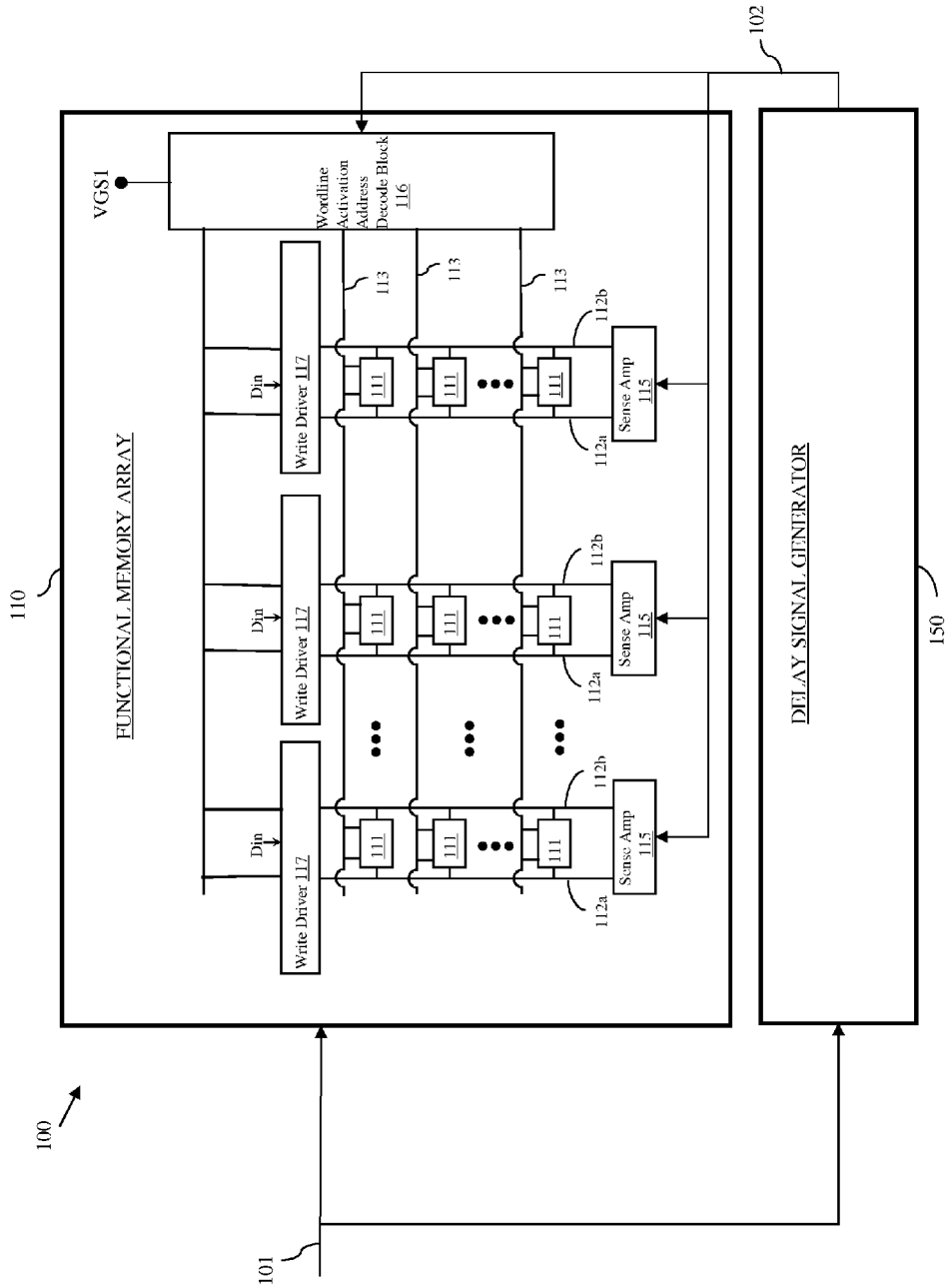
FIG. 1 is a schematic diagram illustrating an embodiment of a memory system.

As mentioned above, memory systems generally comprise an array of essentially identical memory cells (e.g., static random access memory (SRAM) cells, ternary content-addressable memory (TCAM) cells, dynamic random access memory (DRAM) cells, non-volatile random access memory (NVRAM) cells, etc.) that store data values. Depending upon the type of memory cell, different steps may be performed during read operations to determine the stored data values. However, regardless of the type of memory cell, a read operation typically involves the activation of a wordline and, thereby the turning on of at least one access transistor (also referred to herein as a pass gate transistor) for a memory cell followed by the subsequent sensing by a sense amplifier of a charge on at least one bitline connected to the memory cell. For read operation accuracy (i.e., read operation stability), the timing of both the wordline pulse that activates the wordline and the sense amplifier set signal that activates the sense amplifier are critical to ensure that there is a sufficient amount of time delay between when the wordline is activated and when the sense amplifier senses the charge on the bitline(s) to ensure that the stored data value is properly read.

Wordline pulse timing and sense amplifier set signal timing are typically provided by a delay signal output by a delay signal generator. Historically, such delay signal generators incorporate logic devices to output a delay signal with some preset amount of time delay and this preset amount of delay is calculated based on the design of the memory cell. However, manufacturing process variations, temperature variations and/or voltage variations can result in a memory array with memory cells having a relatively large range of required time delays between wordline activating and sense amplifier sensing, particularly as memory cell sizes continue to be scaled. Therefore, recently, delay signal generators have been developed that generate a delay signal having a time delay which tracks the average time delay required by a set of second memory cells. While such tracking delay signal generators provide for greater read operation stability over fixed delay signal generators that simply provide a delay signal with a preset amount of delay, they do not guarantee the read functionality of statistically slow memory cells.

In view of the foregoing, disclosed herein are embodiments of a memory system and an associated operating method. In the memory system, a memory array comprises first memory cells requiring a range of corresponding time delays between wordline activating and bitline sensing for read functionality during a read operation. Thus, in the memory system, a delay signal generator delays an input signal by a selected time delay and, particularly, by a relatively long time delay corresponding to statistically slow memory cells and outputs a delay signal for use in wordline pulse and/or sense amplifier set signal timing. By generating a delay signal that tracks the time delay associated with statistically slow memory cells, the memory system provides for read functionality even in the presence of such slow memory cells. To accomplish this, the delay signal generator can, for example, comprise another memory array with second memory cells having the same design as the first memory cells. However, transistors within the second memory cells are controlled by a lower gate voltage than transistors within the first memory cells in order to mimic the effect of higher threshold voltages, which result in longer time delays and which can be associated with the statistically slow first memory cells. Thus, the embodiments allow for indirect tracking of the time delays of such statistically slow first memory cells.

More particularly, referring to FIG. 1, disclosed herein are embodiments of a memory system 100. Each of the embodiments of the memory system 100 can comprise a memory array 110 (i.e., a functional memory array, also referred to herein as a first memory array) comprising a plurality of first memory cells 111. The first memory array 110 comprising the first memory cells 111 can, for example, be a static random access memory (SRAM) array comprising a plurality of first SRAM cells, a ternary content-addressable memory (TCAM) array comprising a plurality of first TCAM cells, a dynamic random access memory (DRAM) array comprising a plurality of first DRAM cells, a non-volatile random access memory (NVRAM) array comprising a plurality of first NVRAM cells, etc. In any case, each first memory cell 111 can comprise at least one first transistor and, particularly, at least one first field effect transistor (FET) that is controlled by (i.e., enabled by, turned on by, etc.) a first gate voltage Vgs1 (see detailed discussion below).

For purposes of illustration, the first memory array 110 comprising a plurality of first memory cells 111 is described below as being an SRAM array comprising a plurality of SRAM cells. The SRAM cells 111 can be arranged in columns and rows such that each of the SRAM cells 111 in a given column are electrically connected to the same corresponding bitlines 112a-112b and such that each of the SRAM cells 111 in a given row are electrically connected to the same corresponding wordline 113. The SRAM array 110 can further comprise peripheral circuitry (e.g., a wordline activation address decode block 116, write drivers 117, sense amplifiers 115, etc.) that facilitates writing data values to and reading data values from the SRAM cells 111.

Figure 2:
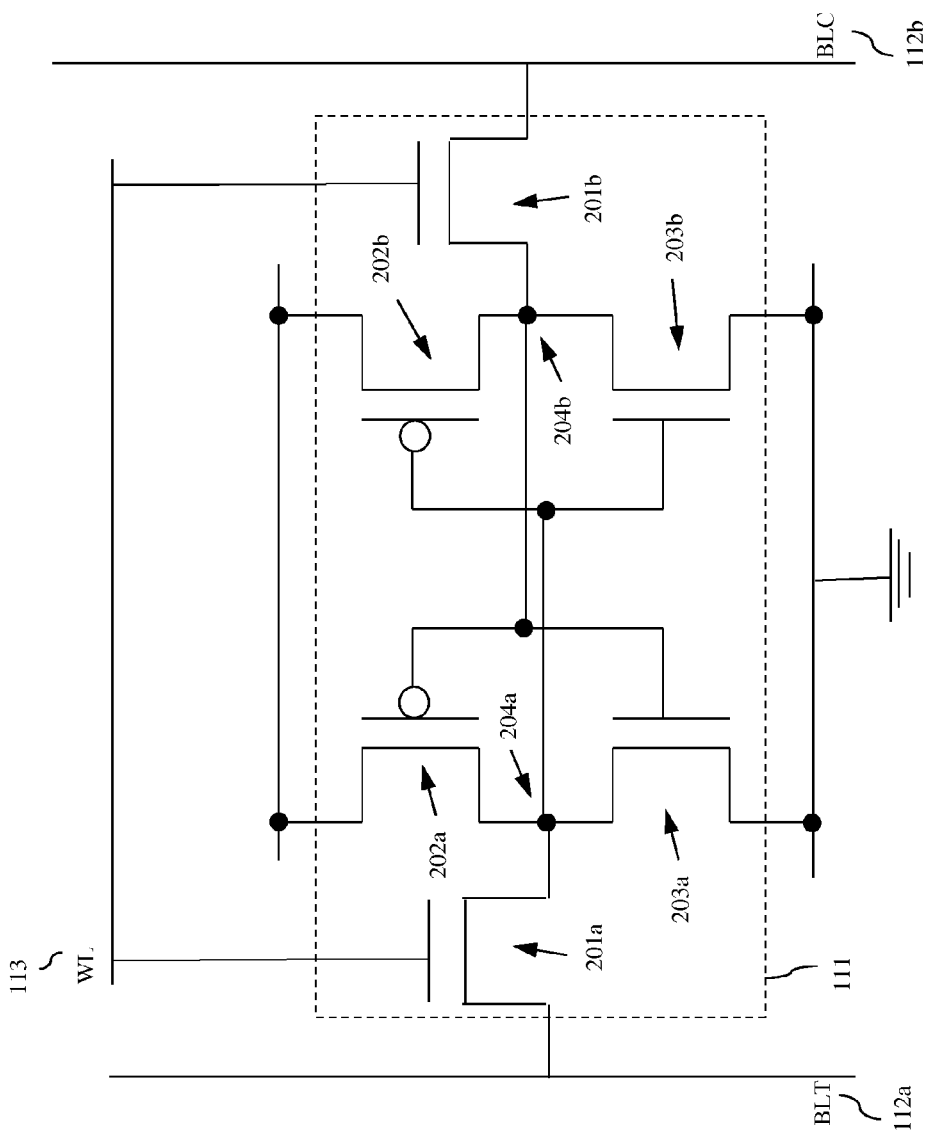
FIG. 2 is a schematic diagram illustrating an exemplary static random access memory (SRAM) cell that can be incorporated into a memory array of the memory system of FIG. 1.

FIG. 2 illustrates an exemplary SRAM cell 111 that can be incorporated into an SRAM memory array 110. Referring to FIG. 2 in combination with FIG. 1, this SRAM cell 111 can comprise a six transistor (6 T) SRAM cell. A 6 T SRAM cell typically comprises a pair of access transistors (also referred to as pass-gate transistors) 201a, 201b (e.g., N-type field effect transistors) and a pair of cross-coupled inverters. Each inverter can comprise a pull-up transistor 202a, 202b (e.g., a P-type field effect transistor) connected in series to a pull-down transistor 203a, 203b (e.g., an N-type field effect transistor). The drain of one of the access transistors (e.g., access transistor 201a) is connected to a node 204a between the pull-up and pull-down transistors 202a and 203a of one of the inverters and the drain of the other access transistor (e.g., access transistor 201b) is connected to a node 204b between the pull-up and pull-down transistors 202b and 203b, of the other inverter. Furthermore, the source of one of the access transistors (e.g., access transistor 201a) is connected to one bitline of a complementary pair of bitlines (e.g., the bitline 112a, which is also referred to as a true bitline (BLT)) and the source of the other access transistor (e.g., access transistor 201b) is connected to the other bitline in the complementary pair of bitlines (e.g., the bitline 112b, also referred to as the complementary bitline (BLC)). The gates of the access transistors 201a, 201b are connected to a wordline (WL) 113.

Such an SRAM cell 111 operates in three different stages: standby, write and read. In the standby state, the cell is idle. In the write stage, a data value is written into the cell. Specifically, if a data value of "1" (i.e., a high data value) is to be written to the node 204a, a "1" is applied to the bitline 112a and a "0" is applied to the bitline 112b. Then, the wordline 113 is activated (i.e., charged to the first gate voltage) to enable (i.e., to turn on) the access transistors 201a, 201b and the data value "1" is stored at node 204a. Contrarily, if a data value of "0" (i.e., a low data value) is to be written to the node 204a, a "0" is applied to the bitline 112a and a "1" is applied to the bitline 112b. Then, the wordline 113 is activated (i.e., charged to the first gate voltage) to enable (i.e., to turn on) the access transistors 201a, 201b and the data value "0" is stored at node 204a. In the reading stage, the data value stored in the cell is read. Specifically, the bitlines 112a, 112b are both pre-charged high (i.e., to a "1") and the wordline 113 is activated (i.e., charged to the first gate voltage) to enable (i.e., to turn on) the access transistors 201a, 201b. When a data value of "1" is stored on node 204a, bitline 112a will remain charged at its pre-charge level of "1" and the bitline 211b will be discharged to "0" through the transistors 203b and 201b. When a data value of "0" is stored on node 204a, bitline 112a will be discharged to "0" through transistors 203a and 201a and the bitline 112b will remain charged at its pre-charge level of "1". A sense amplifier 115 (as shown in FIG. 1) at the end of each column will sense whether bitline 112a or 112b is higher and, thereby will sense the data value stored in the cell 110. This description of a 6 T SRAM cell and its operation is offered for illustration purposes only and is not intended to be limiting. It should be understood that a 6 T SRAM cell with an alternative configuration or another type of SRAM cell (e.g., an eight transistor SRAM cell) could be used.

Figure 3:
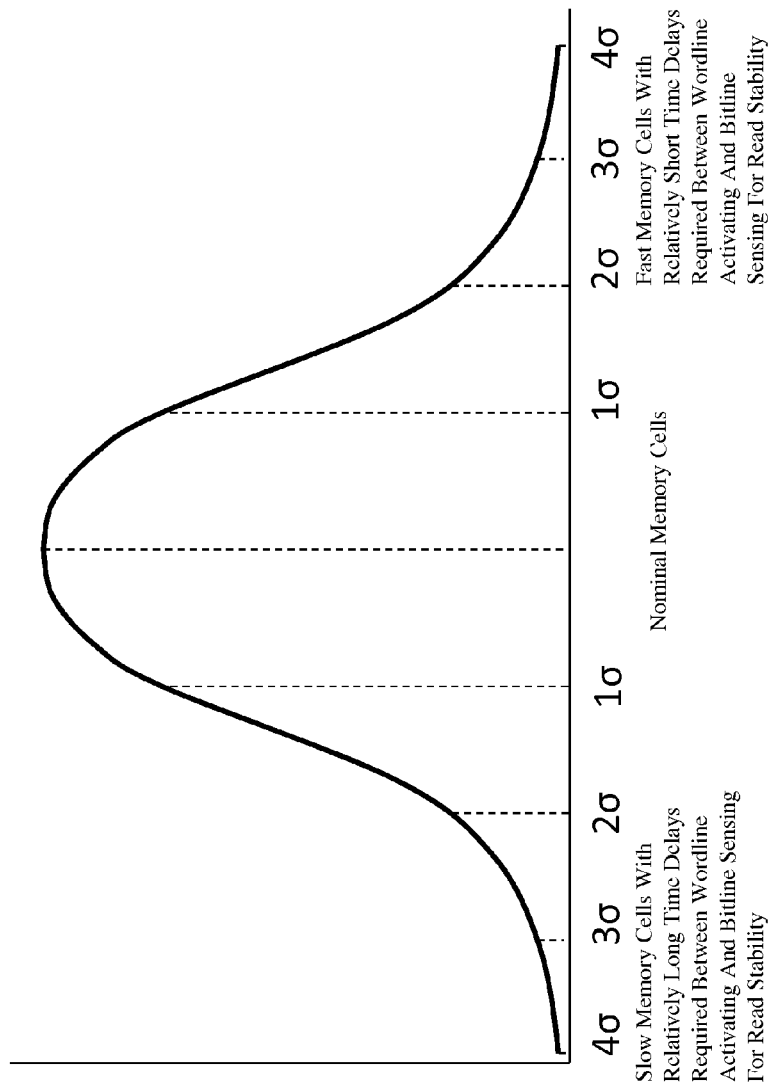
FIG. 3 is a graph illustrating a Gaussian distribution memory cells based on the time delays required between wordline activating and bitline sensing.

Referring again to FIG. 1, as mentioned above, the first memory array 110 can alternatively be any other type of memory array (e.g., a ternary content-addressable memory (TCAM) array comprising a plurality of first TCAM cells, a dynamic random access memory (DRAM) array comprising a plurality of first DRAM cells, a non-volatile random access memory (NVRAM) array comprising a plurality of first NVRAM cells, etc.). Such memory arrays similarly comprise both memory cells, which are each electrically connected to bitline(s) and a wordline, and peripheral circuitry (e.g., a wordline activation address decode block, write drivers, sense amplifiers, etc.) that facilitates writing data values to and reading data values from the memory cells. Therefore, regardless of the type of first memory array 110 used, during read operations, the first memory cells 111 require activation of a wordline and, thereby the turning on of at least one transistor (e.g., access transistor(s)) followed by the subsequent sensing by a sense amplifier of a charge on at least one bitline connected to the memory cell. Consequently, each first memory cell 111 in the first memory array 110 requires a corresponding time delay between wordline activating and bitline sensing for read functionality during a read operation. However, due to manufacturing process variations, temperature variations and/or voltage variations, these first memory cells 111 will inevitably have different performance characteristics and will, thereby require a range of different corresponding time delays between wordline activating and bitline sensing in order to achieve read functionality on a cell-by-cell basis. As shown in the Gaussian distribution graph of FIG. 3, this range of different corresponding time delays may extend from relatively long time delays corresponding to statistically slow memory cells (e.g., 2σ, 3σ or 4σ slow memory cells) to relatively short time delays corresponding to statistically fast memory cells (e.g., 2σ, 3σ or 4σ fast memory cells).

To margin for the different time delays, each of the embodiments of the memory system 100 can further comprise a delay signal generator 150. This delay signal generator 150 can receive (i.e., can be adapted to receive, can be configured to receive, etc.) an input signal 101. This input signal 101 can comprise a clock signal and, more particularly, the same clock signal, which is received by the first memory array 110 and which includes clock transitions for initiating memory cell operations, such as read operations or write operations. The delay signal generator 150 can further generate and output (i.e., can be adapted to generate and output, can be configured to generate and output, etc.) a delay signal 102, based on this input signal 101 and, particularly, based on a clock transition that initiates a read operation. This delay signal 102 can then be used for read operation timing (i.e., for wordline pulse timing and/or sense amplifier set signal timing) of the first memory cells 111 within the first memory array 110. However, to margin particularly for the relatively long time delays associated with statistically slow memory cells (e.g., 2σ, 3σ or 4σ slow memory cells or any other statistically slow memory cells), the delay signal generator 150 of the disclosed memory system 100 embodiments can delay (i.e., can be adapted to delay, can be configured to delay, etc.) the input signal 101 specifically by a selected time delay and this selected time delay can correspond to a time delay within the long time delays associated with statistically slow memory cells. That is, with the selected time delay, the output delay signal 102 used for read operation timing (i.e., for wordline pulse time and/or sense amplifier set signal timing) provides read functionality even for such slow memory cells. For example, the selected time delay can be a time delay associated with 2σ, 3σ or 4σ slow memory cells (or any other statistically slow memory cells) such that the output delay signal 102 used for read operation timing provides read functionality for all 2σ, 3σ or 4σ (as applicable) slow and faster memory cells.

Figure 4:
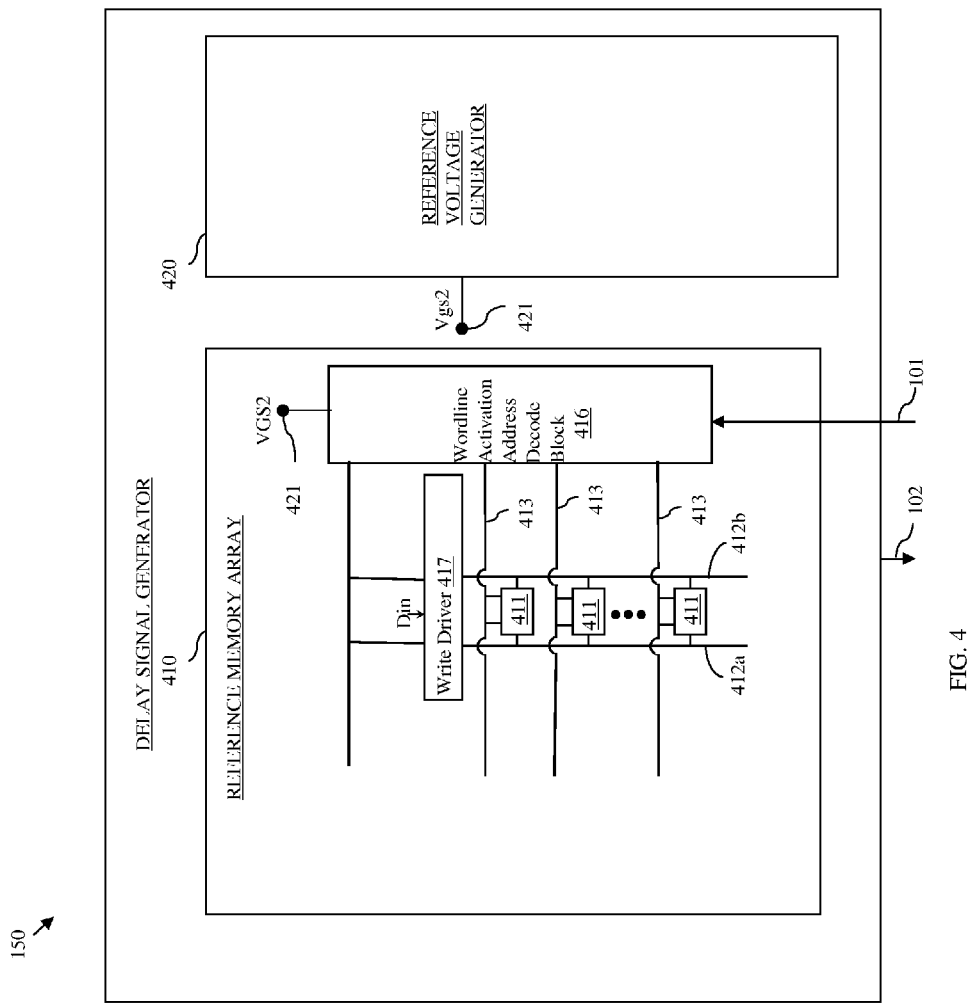
FIG. 4 is a schematic diagram illustrating a delay signal generator that can be incorporated into the memory system of FIG. 1.

FIG. 4 illustrates generally delay signal generator 150 that can be incorporated into the memory system 100 of FIG. 1. Referring to FIG. 4 in combination with FIG. 1, in order to generate such a delay signal 102, the delay signal generator 150 can, for example, comprise another memory array 410 (i.e., a reference memory array, also referred to herein as a second memory array). The second memory array 410 can mimic the first memory array 110. That is, the second memory array 410 can comprise a plurality of second memory cells 411 that are essentially identical to the first memory cells 111 and, specifically, the second memory cells 411 can be the same type of memory cells as the first memory cells 111 (e.g., SRAM cells (as shown in FIG. 2), TCAM cells, DRAM cells, or NVRAM cells, depending upon the type of memory array) with the same configuration, same types of transistors having the same channel lengths, channel widths, threshold voltages, etc. Within the second memory array 410, the second memory cells 411 can each be electrically connected to bitline(s) 412a-b and a wordline 413 and peripheral circuitry (e.g., a wordline activation address decode block 416, write drivers 417, etc.). Since the second memory cells 411 have the same design as the first memory cells 111, manufacturing process variations, temperature variations and/or voltage variations cause the second memory cells 411 to have the same range of different performance characteristics and, thereby essentially the same range of different corresponding time delays between wordline activating and bitline sensing for read functionality during a read operation.

It should be noted that the second memory array 410 may comprise a lesser number of columns and/or rows (e.g., only a single column with 16, 32, etc. rows) of second memory cells 411 connected in parallel in order to reduce the impact of local variation as long as the total number of second memory cells is sufficient to ensure that the same range of different performance characteristics is exhibited and, thereby essentially the same range of different corresponding time delays between wordline activating and bitline sensing for read functionality during a read operation.

In any case, like the first memory cells 111 of the first memory array shown in FIG. 1, the second memory cells 411 of the second memory array 410 shown in FIG. 4 can each comprise at least one transistor (referred to herein as a second transistor) and, particularly, at least one field effect transistor (FET); however, instead of being controlled (i.e., enabled, turned on, etc.) by the same first gate voltage Vgs1 as the first transistor(s) of the first memory cells 111, the second transistor(s) of the second memory cells 411 can be controlled (i.e., enabled, turned on, etc.) particularly during read operations by a second gate voltage Vgs2 that is less than the first gate voltage Vgs1.

For example, if the first and second memory arrays 110, 410 of FIGS. 1 and 2, respectively, each comprise SRAM cells (as shown in FIG. 2), then during read operations the access transistors 201a-b of the first memory cells 111 in the first memory array 110 can be controlled by a first gate voltage Vgs1 through wordline 113 activation, whereas the access transistors 201a-b of the second memory cells 411 in the second memory array 410 can be controlled by a second gate voltage Vgs2 that is less than the first gate voltage Vgs1 through wordline 413 activation. The first gate voltage Vgs1 can comprise a logic supply voltage (Vdd) in the case of a single power supply memory array. Alternatively, this first gate voltage Vgs1 can comprise a cell supply voltage (Vcs) that is typically higher than Vdd in the case dual power supply memory array. Those skilled in the art will recognize that in a dual power supply memory array, a first power supply rail is typically set low (e.g., to Vdd) to conserve power during bitline pre-charge operations, whereas a second power supply rail is typically set sufficiently high (e.g., to Vcs) to supply power for memory cell operations, including wordline activation (e.g., see U.S. patent application Ser. No. 13/307,245, of Braceras et al., filed on Nov. 30, 2011, assigned to International Business Machines Incorporation and incorporated herein by reference). However, regardless of whether the first gate voltage Vgs1 corresponds to Vdd or Vcs, the second gate voltage Vgs2 shall be lower than the first gate voltage.

In any case, controlling the second transistor(s) within the second memory cells 411 of the second memory array 410 using a lower gate voltage Vgs2 than that used for controlling the first transistors of the first memory cells 111 in the first memory array 110 has essentially the same effect as (i.e., mimics the effect of) increasing threshold voltage without changing current characteristics. Specifically, like increasing threshold voltage, decreasing the gate voltage results in longer time delays. This is because the drain to source current (Ids) of a field effect transistor (FET) is proportional to its gate to source voltage (Vgs) (also referred to herein as the gate voltage) minus its threshold voltage (Vt), so reducing the gate voltage in the second transistor(s) of the second memory cells 411 in the second memory array 410 has the same effect as the increased Vt of the first transistor(s) in the first memory cells 111 of the first memory array 110. Thus, the lower gate voltage Vgs2 can be used to increase the corresponding time delays of the second memory cells 411 and the increased time delays can be associated with the longer time delays of statistically slow (i.e., 2σ, 3σ or 4σ slow or other statistically slow) first memory cells 111 with relatively high threshold voltages. Thus, the embodiments allow for indirect tracking of the longer time delays associated with such statistically slow first memory cells. To ensure that the selected time delay is equal to that of a statistically Xσ slow memory cell (i.e., in order to achieve the desired selected time delay corresponding to that of an Xσ slow memory cell, such as a 2σ, 3σ or 4σ slow or other statistically slow memory cell), the second gate voltage Vgs2 can be set so that it is approximately equal to the first gate voltage (e.g., Vdd or Vcs, as applicable) minus (X multiplied by a 1σ threshold voltage (Vt) variation between first transistors across all the first memory cells 111 in the first memory array 110).

For example, to ensure that the selected time delay is equal to that of a statistically 2σ slow memory cell, the second gate voltage Vgs2 can be approximately equal to the first gate voltage Vgs1 (e.g., Vdd or Vcs, as applicable) minus (2 times a 1σ threshold voltage (Vt) variation between first transistors across the first memory cells 111). In this case, if the first gate voltage Vgs1 is Vdd and the 1σ Vt variation is 30 mV, then the second gate voltage Vgs2 should be Vdd-60 mV. To ensure that the selected time delay is equal to that of a statistically 3σ slow memory cell, the second gate voltage Vgs2 can be approximately equal to the first gate voltage Vgs1 (e.g., Vdd or Vcs, as applicable) minus (3 times a 1σ threshold voltage (Vt) variation between first transistors across all the first memory cells 111). In this case, if the first gate voltage Vgs1 is Vdd and the 1σ Vt variation is 30 mV, then the second gate voltage Vgs2 should be Vdd-90 mV. To ensure that the selected time delay is equal to that of a statistically 4σ slow memory cell, the second gate voltage Vgs2 can be approximately equal to the first gate voltage Vgs1 (e.g., Vdd or Vcs, as applicable) minus (4 times a 1σ threshold voltage (Vt) variation between first transistors across all the first memory cells 111). In this case, if the first gate voltage Vgs1 is Vdd and the 1σ Vt variation is 30 mV, then the second gate voltage Vgs1 should be Vdd-120 mV, and so on.

Figure 5:
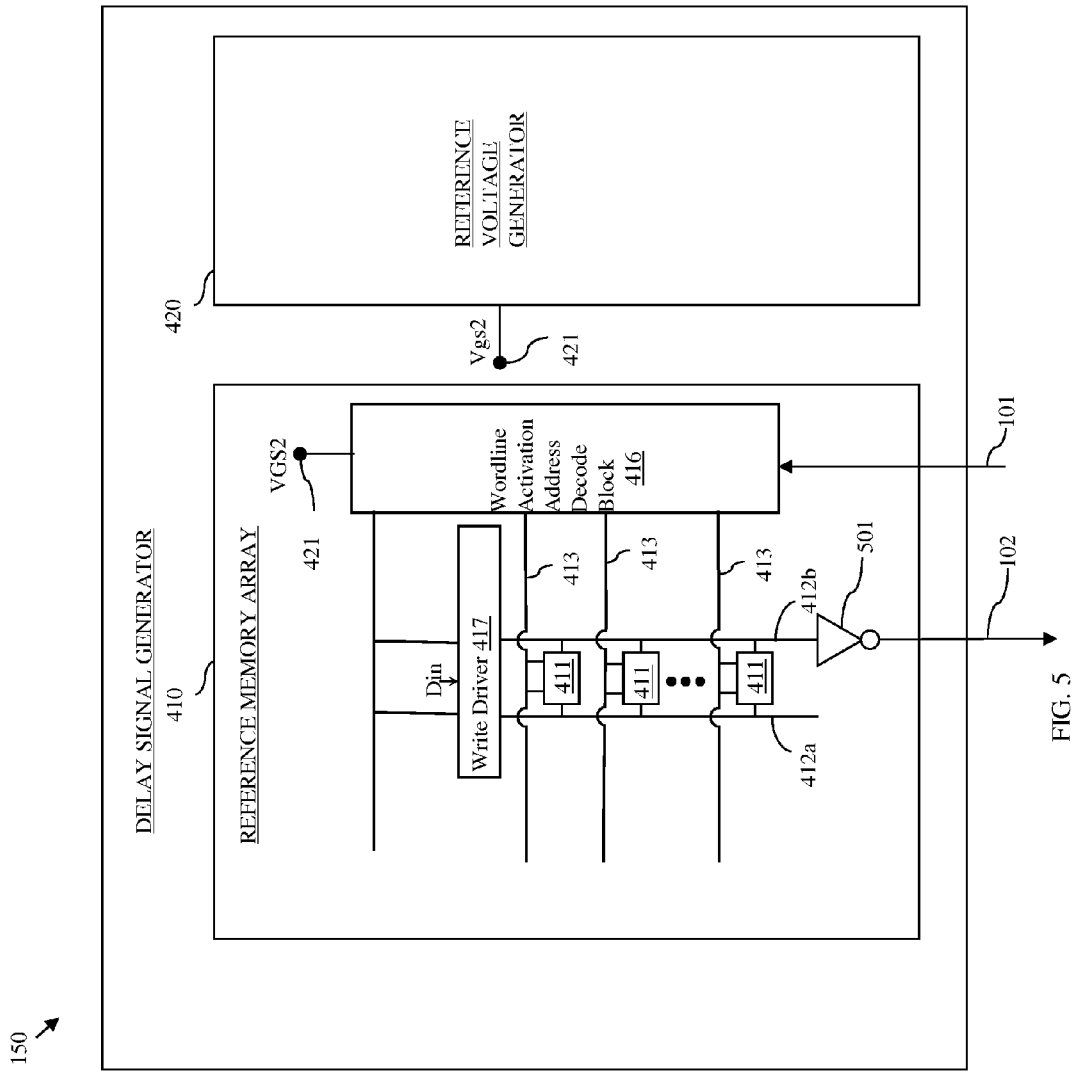
FIG. 5 is a schematic diagram illustrating an exemplary configuration for the delay signal generator of FIG. 4.

FIG. 5 illustrates one exemplary delay signal generator 150 that can be incorporated into the memory system 100 of FIG. 1. As shown in FIG. 5, the delay signal generator 150 can, optionally, be configured so that the second memory array 410 itself receives the input signal 101 and generates and outputs the delay signal 102. Specifically, in this case, the second memory cells 411 can be arranged in a single column and the wordline activation address decode block 416 can receive the input signal 101 and, in response to the input signal 101, can activate all of the wordlines 413 with the lower gate voltage Vgs2. This reduces some local variation and also turns on all of the second memory cells 411 so that they each pull down the same bitline 412b at the same time. Thus, bitline 412b is a full swing bitline that will eventually switch from rail to rail. The bitline 412b can be electrically connected to an inverter 501 (rather than a sense amplifier as shown in the first memory array 110). When the bitline 412b completes the full swing (i.e., switches from rail to rail), the inverter 501 can output the delay signal 102.

Figure 6:
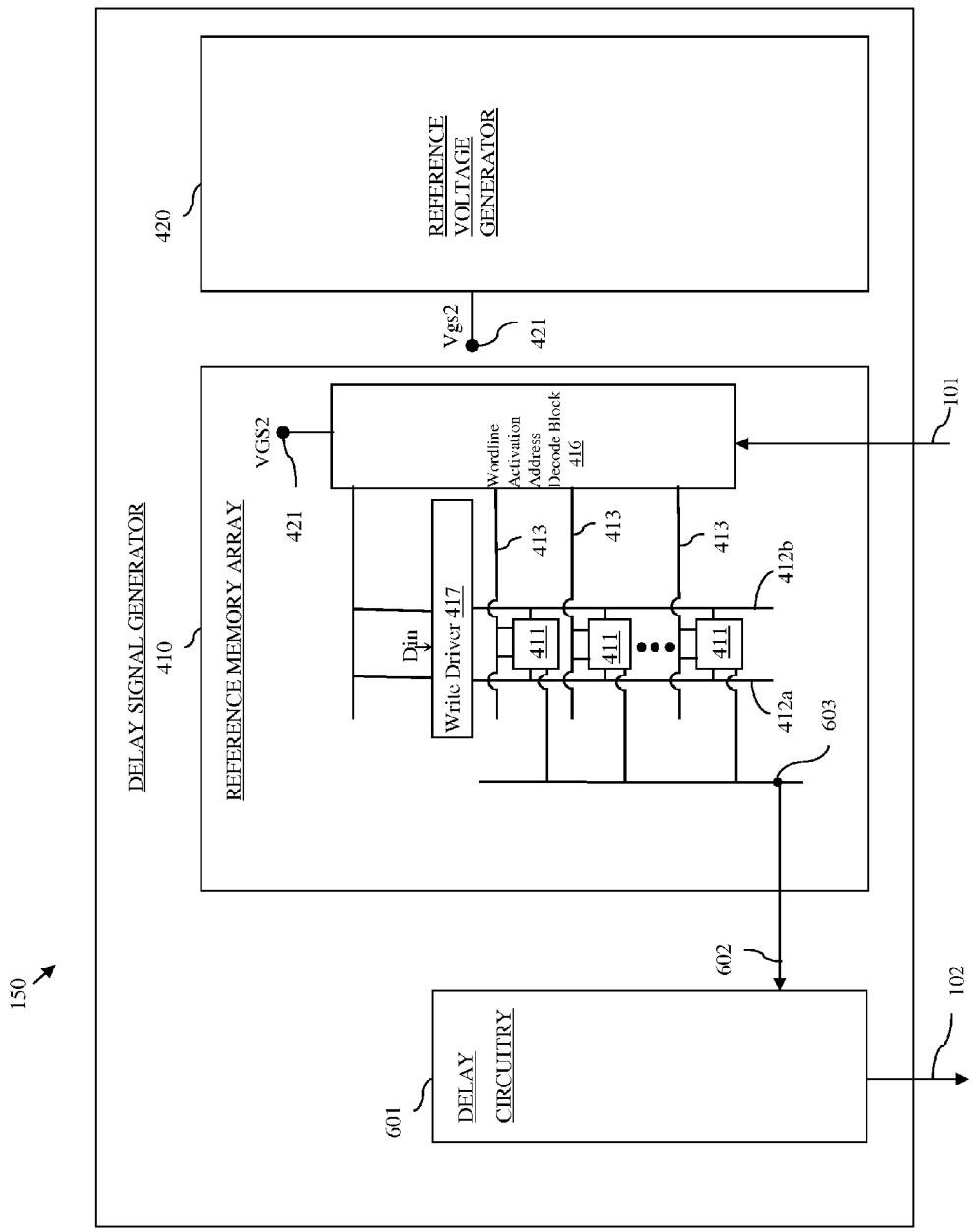
FIG. 6 is a schematic diagram illustrating another exemplary configuration for the delay signal generator of FIG. 4.

Alternatively, FIG. 6 illustrates another exemplary delay signal generator 150 that can be incorporated into the memory system 100 of FIG. 1. As shown in FIG. 6, in this case, the delay signal generator 150 can optionally be configured with additional delay circuitry 601 for outputting the delay signal 102 based on a reference current 602 from the second memory array 410. Specifically, in this embodiment, the second memory cells 411 can, for example, be arranged in a single column and the wordline activation address decode block 416 can receive the input signal 101 and, in response to the input signal 101, can activate all of the wordlines 413 with the lower gate voltage Vgs2. Then an average or reference current 602 can be obtained from the second memory array 410. For example, as described in U.S. Pat. No. 8,233,337 of Arsovski et al, issued on Jul. 31, 2012, assigned to International Business Machines Corporation and incorporated herein by reference, current can be drawn to a single reference current output node 603 from each of the second memory cells 411 (e.g., through an access transistor of each second memory cell 411, through a pull-down transistor of each second memory cell 411 or through a pull-down transistor of each second memory cell 411). The delay signal generator 150 can further comprise delay circuitry 602 that receives the reference current 602 and, based on the reference current 602, outputs the delay signal 102. Delay circuitry used to generate a delay signal based on a reference current is well known in the art (e.g., see U.S. Pat. No. 8,233,337 of Arsovski, which was incorporated by reference above; see also U.S. Pat. No. 8,228,713 of Arsovski et al., issued on Jul. 24, 2012, assigned to International Business Machines Corporation and incorporated herein by reference). Thus, the details of the delay circuitry 601 are omitted from this specification in order to allow the reader to focus on the salient aspects of the disclosed embodiments.

Referring again to delay signal generator 150 shown generally in FIG. 4 in combination with the memory system 100 shown in FIG. 1, in order to operate the second memory cells 411, as discussed above, the delay signal generator 150 can further comprise a reference voltage generator 420 that generates and outputs (i.e., that is adapted to generate and output, that is configured to generate and output, etc.) a reference voltage and, particularly, the second gate voltage Vgs2 at a reference voltage output node 421. The second memory array 410 and, particularly, the wordline activation address decode block 416 thereof, can connect (i.e., can be adapted to connect, can be configured to connect, etc.) wordlines 413 to this output node 421 in order to activate the wordlines 413 and, thereby control (i.e., enable, turn on, etc.) the second transistor(s) of the second memory cells 411 using the second gate voltage Vgs2. For example, in the case of SRAM cells, as shown in FIG. 2, the wordlines 413 can activate the access transistors 201a-b, using the second gate voltage Vgs2. Wordline activation address decode blocks for connecting wordlines to a voltage supply are well known in the art and, thus, the details of such address decode blocks are omitted from this specification in order to allow the reader to focus on the salient aspects of the disclosed embodiments.

In one embodiment of the memory system 100, this reference voltage generator 420 can comprise a fixed reference voltage generator that generates and outputs (i.e., is adapted to generate and output, is configured to generate and output, etc.), at a reference voltage output node 421, a fixed reference voltage equal to a predetermined second gate voltage (Vgs2), which as discussed above is less than the first gate voltage (Vgs1) such that ultimately the input signal 101 is delayed by the selected time delay in order to generate and output the desired delay signal 102. This fixed reference voltage generator can comprise, for example, a bandgap reference voltage generator or any suitable reference voltage generator capable of outputting a fixed reference voltage. Such fixed reference voltage generators are well known in the art and, thus, the details thereof are omitted from this specification in order to allow the reader to focus on the salient aspects of the disclosed embodiments.

In other embodiments of the memory system 100, the reference voltage generator 420 can comprise a variable reference voltage generator that selectively generates and outputs (i.e., that is adapted to selectively generate and output, that is configured to selectively generate and output, etc.), at a single reference voltage output node 421, a selected one of multiple possible second gate voltages. The multiple possible second gate voltages can each be less than the first gate voltage and the selected one of the multiple possible second gate voltages can be preselected such that ultimately the input signal 101 is delayed by a selected time delay in order to generate and output a delay signal 102 with a desired time delay. For example, one possible second gate voltage can be selected so that the input signal 101 is delayed by a selected time delay corresponding to the time delay associated with 2σ slow memory cells, another possible second gate voltage can be selected so that the input signal 101 is delayed by a selected time delay corresponding to the time delay associated with 3σ slow memory cells, another possible second gate voltage can be selected so that the input signal 101 is delayed by a selected time delay corresponding to the time delay associated with 4σ slow memory cells, and so on.

Figure 7:
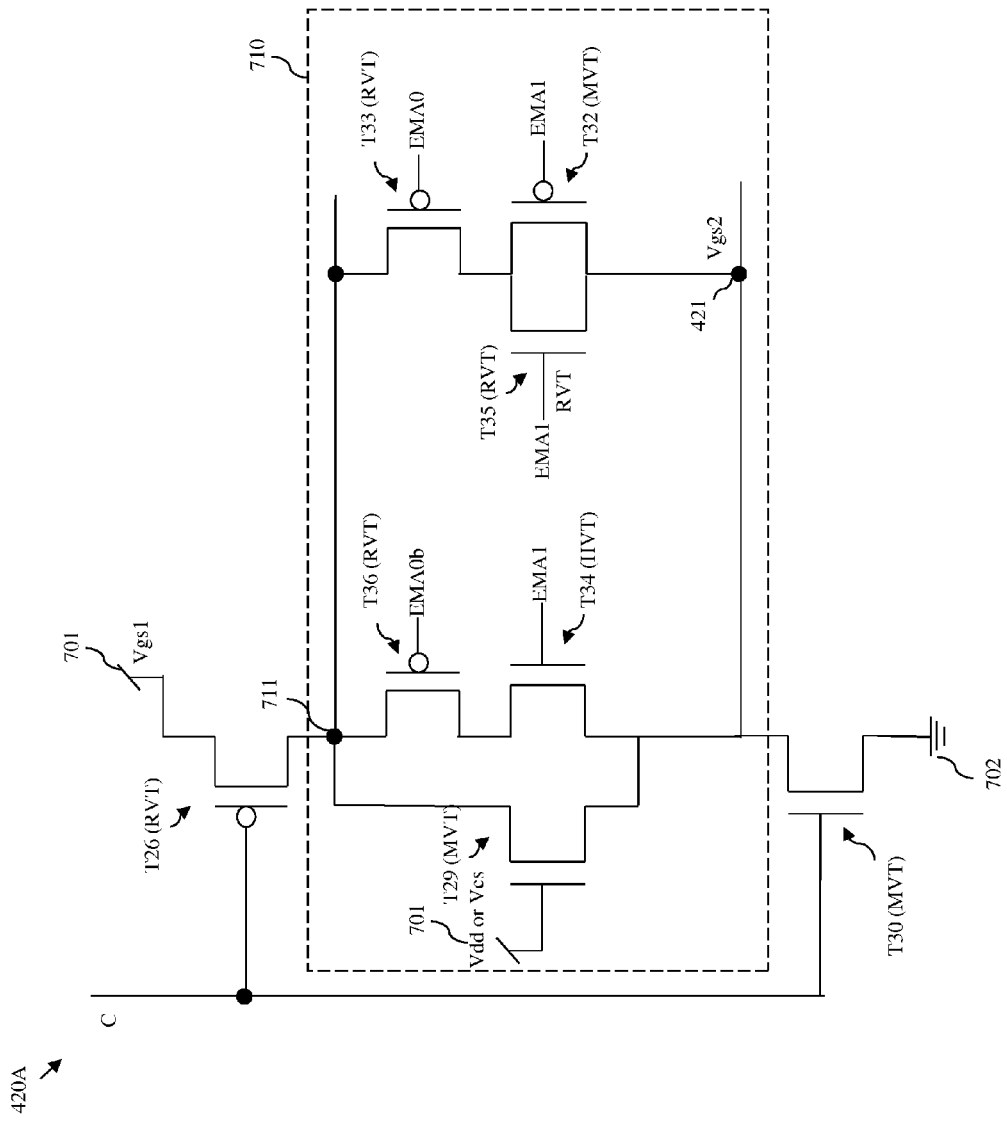
FIG. 7 is a schematic diagram illustrating an exemplary variable reference voltage generator that can be incorporated into the delay signal generator of FIG. 4.
Figure 8:
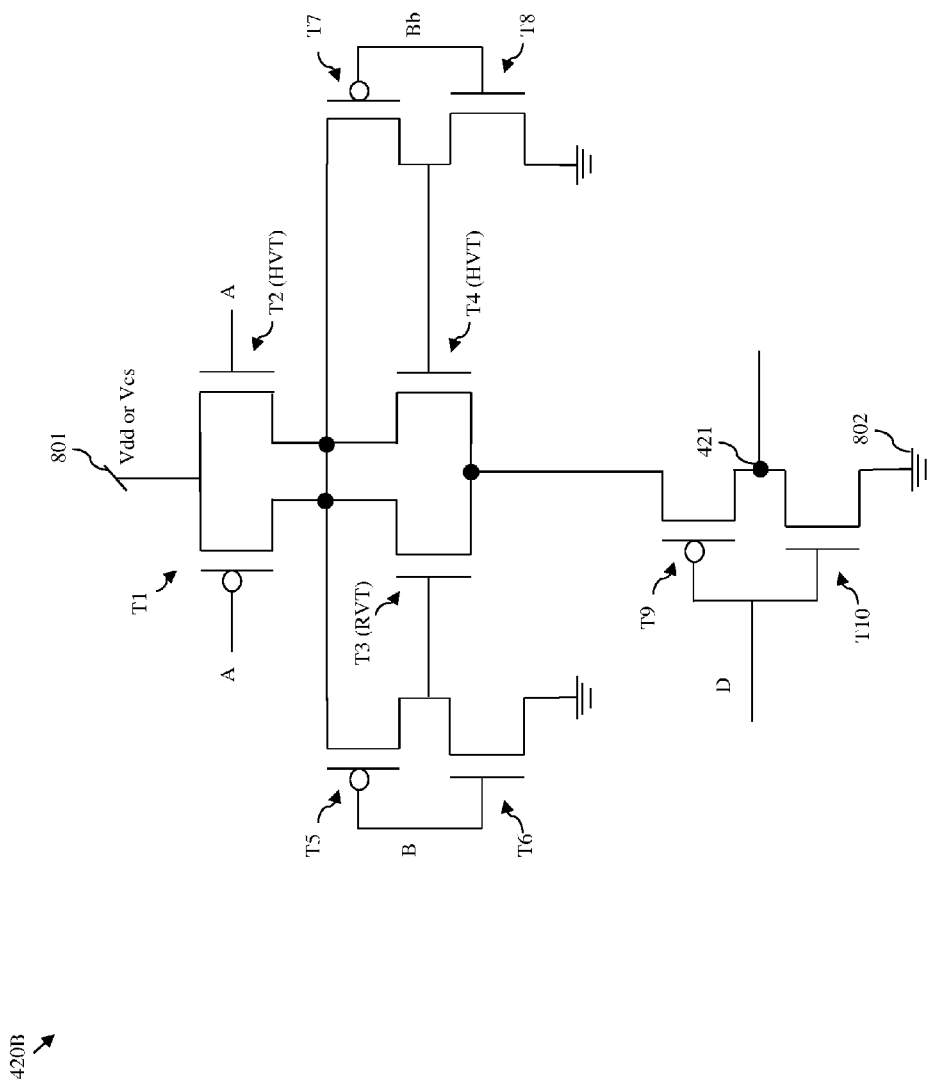
FIG. 8 is a schematic diagram illustrating another exemplary variable reference voltage generator that can be incorporated into the delay signal generator of FIG. 4.

FIGS. 7 and 8 are schematic diagrams illustrating exemplary variable reference voltage generators 420A and 420B that can be incorporated into the delay signal generator 150 of FIG. 4. Each of these variable reference voltage generators 420A and 420B comprises a reference voltage output node 421 and a plurality of field effect transistors (FETs) having different threshold voltages (Vt) (see detailed discussion below) electrically connected to the reference voltage output node 421 such that selective activation of the FETs alone and/or in combination pulls down the voltage on the reference voltage output node 421 from the first gate voltage (e.g., Vdd or Vcs) by a given amount, thereby resulting in the selected one of the multiple possible second gate voltages at that reference voltage output node 421.

Referring to FIG. 7, the variable reference voltage generator 420A can comprise a first voltage rail 701, which supplies the first gate voltage Vgs1 (e.g., Vdd or Vcs, as discussed above), and a second voltage rail 702 (e.g., ground). The variable reference voltage generator 420A can further comprise a reference voltage generation circuit 710 having a first node 711 and a second node (i.e., the reference voltage output node 421). A P-type field effect transistor (PFET) T26 having a regular threshold voltage (RVT) can gate a positive power supply from the first voltage rail 701 to the first node 711 and an N-type field effect transistor (NFET) T30 having a medium-high threshold voltage (MVT) can gate a negative power supply from the second voltage rail 702 to the reference voltage output node 421. The reference voltage generation circuit 710 can further comprise a plurality of additional PFETs T36, T33 and T32 and NFETs T29, T34, and T35 having different threshold voltages (e.g., RVT, MVT and high threshold voltage (HVT), which is between RVT and MVT) electrically connected between the first node 711 and the reference voltage output node 421 such that selective activation of the individual PFETs and NFETs alone and/or in combination pulls down the voltage on the reference voltage output node 421 from the first gate voltage (e.g., Vdd or Vcs) at the first voltage rail 701 by a selective amount, thereby resulting in the selected one of the multiple possible second gate voltages (Vgs2) at that reference voltage output node 421.

More specifically, as illustrated, in the variable reference voltage generator 420A of FIG. 7, the same wire C controls the gates of the PFET power gate T26 and the NFET power gate T20, wire EMA0 controls gate of the PFET T33, wire EMA0b (which is always the complement of EMA0) controls the gate of PFET T36, and the same wire EMA1 controls the gates of the NFETs T34 and T35 as well as the PFET T32. Those skilled in the art will recognize that a low gate signal (e.g., 0) will turn on a PFET but turn off an NFET. Contrarily, a high gate signal (e.g., 1) will turn on an NFET and turn off a PFET. Thus, given the configuration of the variable reference voltage circuit 420A of FIG. 7, switching the wires C, EMA0, EMA0b and EMA1 to high or low will impact the reference voltage at the output node 421.

For example, when wire C is low, RVT PFET T26 is turned on and MVT NFET T30 is off so the entire net is at Vdd (or if applicable Vcs). In this case, if both EMA0 and EMA1 are low and EMA0b is high, the definitive path from the first voltage rail 701 to the reference voltage output node 421 is through PFET T26, PFET T33 and PFET T32 and, as a result, none of the transistors reduce VGS 1 so the reference voltage Vgs2 on the reference voltage output node 421 will be unchanged (i.e., Vdd or if applicable Vcs). If both EMA1 and EMA0b are high and EMA0 is low, the definitive path from the first voltage rail 701 to the reference voltage output node 421 is through PFET T26, PFET T33 and NFET T35 and, as a result, the reference voltage Vgs2 on the reference voltage output node 421 will be determined based on the threshold voltage of the NFET T35 and, particularly, will be Vdd (or if applicable Vcs) minus RVT (i.e., minus the Vt of NFET T35). If both EMA0 and EMA1 are high and EMA0b is low, the definitive path from the first voltage rail 701 to the reference voltage output node 421 is through PFET T26, PFET T36 and NFET T34 and, as a result, the reference voltage Vgs2 on the reference voltage output node 421 will be determined based on the threshold voltage of the NFET T34 and, particularly, will be Vdd (or if applicable Vcs) minus HVT (i.e., minus the Vt of NFET T34). Finally, if EMA0 is high and EMA0b and EMA1 are low, the definitive path from the first voltage rail 701 to the reference voltage output node 421 is through PFET T26 and NFET T29 and, as a result, the reference voltage Vgs2 on the reference voltage output node 421 will be determined based on the threshold voltage of the NFET T29 and, particularly, will be Vdd (or if applicable Vcs) minus MVT (i.e., minus the Vt of NFET T29). Thus, the variable reference voltage generator 420A allows for any one of four different voltages to be output at the reference voltage output node 421.

Alternatively, referring to FIG. 8, the variable reference voltage generator 420B can comprise a first voltage rail 801 that supplies the first gate voltage Vgs1 (e.g., Vdd or Vcs, as discussed above) and a second voltage rail 802 (e.g., ground). It can further comprise a plurality of field effect transistors FETS (T1-T10), including PFETs T1, T5, T7 and T9 and NFETs T2, T3, T4, T6, T8 and T10, having different threshold voltages (e.g., regular threshold voltage (RVT) (see T3), medium-high threshold voltage (MVT) (see T1, and T5-10) and high threshold voltage (HVT) (see T2 and T4), which is between RVT and MVT) electrically connected between the first node the first voltage rail 801 and the second voltage rail 802. These FETs T1-10 can be arranged in pairs, as illustrated, such that selective activation of the individual PFETs and NFETs alone and/or in combination pulls down the voltage on the reference voltage output node 421 between the complementary pair of FETs T9 and T10 from the first gate voltage Vgs1 (e.g., Vdd or Vcs) at the first voltage rail 801 by a selective amount, thereby resulting in the selected one of the multiple possible second gate voltages (Vgs2) at that reference voltage output node 421.

More specifically, as illustrated, in the variable reference voltage generator 420B of FIG. 8, the same wire A controls the gates of the complementary pair of FETs T1 and T2, which are connected in series to the first voltage rail 801. The same wire B controls the gates of the complementary pair of FETs T5 and T6 and the same wire Bb, which is always in an opposite state as the wire B, controls the gates of the complementary pair of FETs T7 and T8. The node between FETs T5 and T6 controls the gate of NFET T3 and the node between FETs T7 and T8 controls the gate of NFET T4. Finally, the same wire D controls the gates of the complementary pair of FETs T9 and T10, which are connected in series to the second voltage rail 802. Those skilled in the art will recognize that a low gate signal (e.g., 0) will turn on a PFET but turn off an NFET. Contrarily, a high gate signal (e.g., 1) will turn on an NFET and turn off a PFET. Thus, given the configuration of the variable reference voltage circuit 420B of FIG. 8, switching the wires A, B and Bb to high or low will impact the reference voltage at the output node 421 by creating a specific pull-up path to Vgs1 (e.g., Vdd or Vcs) that passes through 1 or 2 NFETs.

For example, when wire D is low, PFET T9 is turned on and NFET T10 is off so the entire net is at Vdd (or if applicable Vcs). In this case, when wires A and B are low and wire Bb is high, the definitive path from the first voltage rail 801 to the reference voltage output node 421 is through PFET T1, NFET T3 and PFET T9 and, as a result, the reference voltage Vgs2 on the reference voltage output node 421 will be determined based on the threshold voltage of the NFET T3 and, particularly, will be Vdd (or if applicable Vcs) minus RVT (i.e., minus the Vt of NFET T3). When wires A and Bb are low and wire B is high, the definitive path from the first voltage rail 801 to the reference voltage output node 421 is through PFET T1, NFET T4 and PFET T9 and, as a result, the reference voltage Vgs2 on the reference voltage output node 421 will be determined based on the threshold voltage of the NFET T4 and, particularly, will be Vdd (or if applicable Vcs) minus HVT (i.e., minus the Vt of NFET T4). When wires A and Bb are high and wire B is low, the definitive path from the first voltage rail 801 to the reference voltage output node 421 is through NFET T2, NFET T3 and PFET T9 and, as a result, the reference voltage Vgs2 on the reference voltage output node 421 will be determined based on the threshold voltages of the NFETs T2 and T3 and, particularly, will be Vdd (or if applicable Vcs) minus HVT (i.e., minus the Vt of NFET T2) minus RVT (i.e., minus the Vt of NFET T3). When wires A and B are high and wire Bb is low, the definitive path from the first voltage rail 801 to the reference voltage output node 421 is through NFET T2, NFET T4 and PFET T9 and, as a result, the reference voltage Vgs2 on the reference voltage output node 421 will be determined based on the threshold voltages of the NFETs T2 and T4 and, particularly, will be Vdd (or if applicable Vcs) minus 2HVT (i.e., minus the Vt of NFET T2 and the Vt of NFET T4).

The variable reference voltage generators of FIGS. 7 and 8 are offered for illustration purposes and are not intended to be limiting. Any other suitable variable reference voltage generator could alternatively be incorporated into the delay signal generator 150 in order to provide a second gate voltage Vgs2 that is less than a first gate voltage Vgs1 (i.e., Vdd or Vcs).

Figure 9:
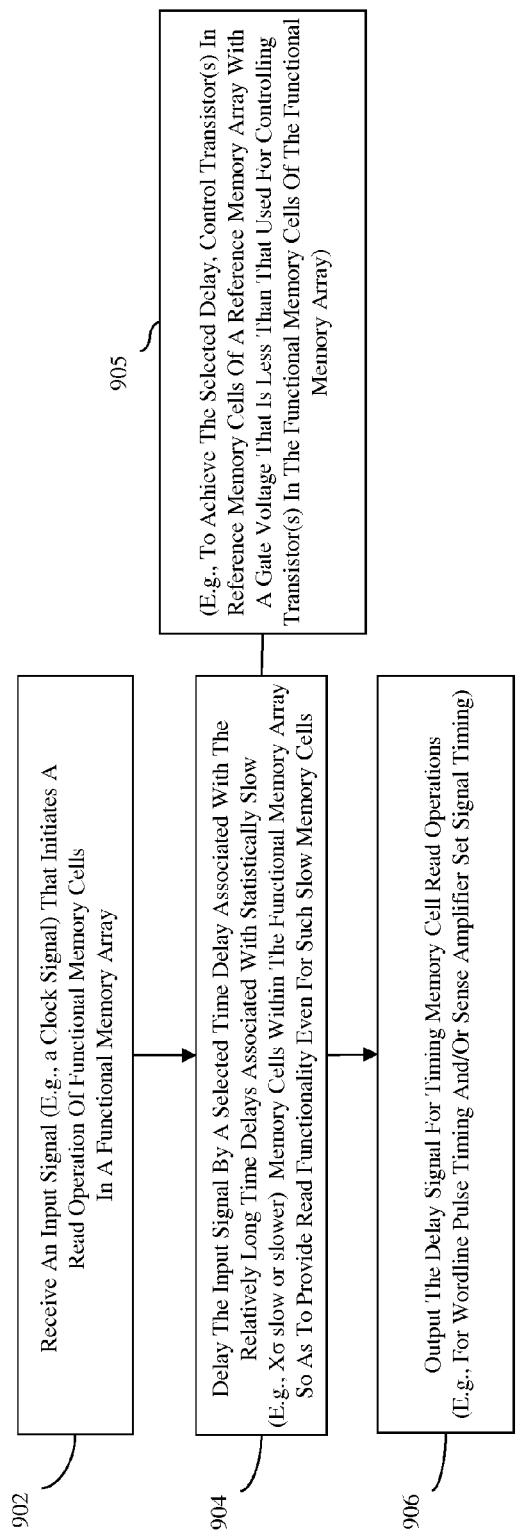
FIG. 9 is a flow diagram illustrating an embodiment of a method of operating a memory system.

Referring to FIG. 9, also disclosed herein are embodiments of an associated method of operating a memory system 100, which comprises a memory array 110 (i.e., a functional memory array, also referred to herein as a first memory array) and a delay signal generator 150, as described in detail above and illustrated in FIGS. 1 and 4.

In summary, the first memory array 110 can comprise a plurality of first memory cells 111. Each first memory cell 111 comprises a least one transistor (i.e., a first transistor) that is controlled by a first gate voltage (e.g., Vdd or Vcs). The first memory cells 111 require corresponding time delays between wordline activating and bitline sensing for read functionality during a read operation. However, due to manufacturing process variations, temperature variations and/or voltage variations, the first memory cells 111 have different performance characteristics and, thereby require a range of different corresponding time delays between the wordline activating and the bitline sensing. This range can extend from relatively long time delays corresponding to statistically slow memory cells to relatively short time delays corresponding to statistically fast memory cells. To margin for this range in required time delays, the delay signal generator 150 can be configured to output a delay signal 102 for timing the read operations (e.g., for wordline pulse timing and/or sense amplifier set signal timing) of the first memory cells 111 in the first memory array 110. The delay signal generator 150 can comprise another memory array 410 (i.e., a reference memory array, also referred to herein as a second memory array) and a reference voltage generator 420. The second memory array 410 can comprise a plurality of second memory cells 411, which each comprise at least one second transistor and which are essentially identical to the first memory cells 111. That is, the second memory cells 411 can be the same type of memory cells as the first memory cells 111 with the same configuration, same types of transistors having the same channel lengths, channel widths, threshold voltages, etc. Since the second memory cells 411 have the same design as the first memory cells 111, manufacturing process variations, temperature variations and/or voltage variations cause the second memory cells 411 to have the same range of different performance characteristics and, thereby essentially the same range of different corresponding time delays between wordline activating and bitline sensing for read functionality during a read operation.

The process steps of the method embodiments can be performed by the delay signal generator 150 of that memory system 100 and can comprise first receiving an input signal 101 (902). This input signal 101 can comprise a clock signal and, more particularly, the same clock signal, which is received by a memory array 110 (i.e., a functional memory array, also referred to herein as a first memory array) and which includes clock transitions for initiating memory cell operations, such as read operations or write operations.

Next, this input signal 101 can be delayed so as to generate a delay signal 102 (904). The process step 904 of delaying the input signal 101 can specifically be performed by the delay signal generator 150 such that the input signal 101 is delayed by a selected time delay and such that this selected time delay is within the relatively long time delays associated with statistically slow memory cells within the memory array 110 so as to provide read functionality even for such slow memory cells. For example, the selected time delay can be a time delay associated with 2σ, 3σ or 4σ slow memory cells in order to provide read functionality for 2σ, 3σ or 4σ (as applicable) slow and faster memory cells. To accomplish this, the process 904 of delaying the input signal 101 can involve controlling the second transistor(s) of the second memory cells 411 of the second memory array 410 with a second gate voltage Vgs2, which is less than the first gate voltage (e.g., Vdd or Vcs) used to control the first transistor(s) of the first memory cells 111 of the first memory array 110 and which is predetermined such that the input signal 101 is delayed by the selected time delay (905). Controlling the second transistor(s) within the second memory cells 411 of the second memory array 410 at process 905 using a lower gate voltage Vgs2 than that used for controlling the first transistors of the first memory cells 111 in the first memory array 110 has essentially the same effect as (i.e., mimics the effect of) increasing threshold voltage without changing current characteristics. Specifically, like increasing threshold voltage, decreasing the gate voltage results in longer time delays. This is because the drain to source current (Ids) of a field effect transistor (FET) is proportional to its gate to source voltage (Vgs) (also referred to herein as the gate voltage) minus its threshold voltage (Vt), so reducing the gate voltage in the second transistor(s) of the second memory cells 411 in the second memory array 410 has the same effect as the increased Vt of the first transistor(s) in the first memory cells 111 of the first memory array 110. Thus, the lower gate voltage can be used to increase the corresponding time delays of the second memory cells 411 and the increased time delays can be associated with the longer time delays of statistically slow (i.e., 2σ, 3σ or 4σ slow) first memory cells 111 with relatively high threshold voltages. Thus, the embodiments allow for indirect tracking of the longer time delays associated with such statistically slow first memory cells. To ensure that the selected time delay is equal to that of a statistically Xσ slow memory cell (i.e., in order to achieve the desired selected time delay corresponding to that of an Xσ slow memory cell, such as a 2σ, 3σ or 4σ slow memory cell), the second gate voltage Vgs2 can be set so that it is approximately equal to the first gate voltage (e.g., Vdd or Vcs, as applicable) minus (X multiplied by a 1σ threshold voltage (Vt) variation between first transistors across all the first memory cells 111 in the first memory array).

Finally, the method can further comprise outputting the delay signal 102 for timing read operations (e.g., for wordline pulse timing and/or sense amplifier set signal timing) within the memory system 100 and, particularly, within the first memory cells 111 of the first memory array 110 (906).

It should be understood that the terminology used herein is for the purpose of describing particular embodiments only and is not intended to be limiting. As used herein, the singular forms "a", "an" and "the" are intended to include the plural forms as well, unless the context clearly indicates otherwise. It should further be understood that the terms "comprises" "comprising", "includes" and/or "including", as used in this specification, specify the presence of stated features, integers, steps, operations, elements, and/or components, but do not preclude the presence or addition of one or more other features, integers, steps, operations, elements, components, and/or groups thereof. Additionally, it should be understood that the corresponding structures, materials, acts, and equivalents of all means or step plus function elements in the claims below are intended to include any structure, material, or act for performing the function in combination with other claimed elements as specifically claimed. The above-description has been presented for purposes of illustration, but is not intended to be exhaustive or limiting. Many modifications and variations will be apparent to those of ordinary skill in the art without departing from the scope and spirit of the disclosed embodiments.

Therefore, disclosed above are embodiments of a memory system and an associated operating method. In the memory system, a memory array comprises first memory cells requiring a range of corresponding time delays between wordline activating and bitline sensing for read functionality during a read operation. Thus, in the memory system, a delay signal generator delays an input signal by a selected time delay and, particularly, by a relatively long time delay corresponding to statistically slow memory cells and outputs a delay signal for use in wordline pulse and/or sense amplifier set signal timing. By generating a delay signal that tracks the time delay associated with statistically slow memory cells, the memory system provides for read functionality even in the presence of such slow memory cells. To accomplish this, the delay signal generator can, for example, comprise another memory array with second memory cells having the same design as the first memory cells. However, transistors within the second memory cells are controlled by a lower gate voltage than transistors within the first memory cells in order to mimic the effect of higher threshold voltages, which result in longer time delays and which can be associated with the statistically slow first memory cells. Thus, the embodiments allow for indirect tracking of the time delays of such statistically slow first memory cells.

What is claimed is:

1. A memory system comprising:
a first memory array comprising a plurality of first memory cells,
each first memory cell being identical in design and requiring a corresponding time delay between wordline activating and bitline sensing during a read operation, and
said plurality of first memory cells requiring a range of different corresponding time delays between said wordline activating and said bitline sensing from long time delays corresponding to slow memory cells to short time delays corresponding to fast memory cells, said range of different corresponding time delays being required due to different performance characteristics of said memory cells and said different performance characteristics being caused by at least one of process variations, temperature variations and voltage variations; and
a delay signal generator receiving an input signal and delaying said input signal by a selected time delay within said long time delays so as to generate and output a delay signal that ensures functionality of at least some of said slow memory cells during said read operation.

2. The memory system of claim 1, said first memory cells comprising any of static random access memory (SRAM) cells, ternary content-addressable memory (TCAM) cells, dynamic random access memory (DRAM) cells, and non-volatile random access memory (NVRAM) cells.

3. The memory system of claim 1, said input signal comprising a clock transition that initiates said read operation.

4. The memory system of claim 1, said selected time delay being at least as long as that of a statistically slow memory cell.

5. The memory system of claim 1,
said delay signal generator comprising a second memory array comprising a plurality of second memory cells having a same design as said first memory cells such that said second memory cells similarly require said range of different corresponding time delays,
said first memory cells each comprising at least one first transistor controlled by a first gate voltage, and
said second memory cells each comprising at least one second transistor controlled by a second gate voltage that is less than said first gate voltage such that said input signal is delayed by said selected time delay.

6. The memory system of claim 5, said second memory array outputting said delay signal.

7. The memory system of claim 5, said second memory array outputting a reference current and said delay signal generator further comprising delay circuitry that outputs said delay signal based on said reference current.

8. A memory system comprising:
a first memory array comprising a plurality of first memory cells, each first memory cell being identical in design and comprising at least one first transistor controlled by a first gate voltage, each first memory cell requiring a corresponding time delay between wordline activating and bitline sensing during a read operation, and said plurality of first memory cells requiring a range of different corresponding time delays between said wordline activating and said bitline sensing from long time delays corresponding to slow memory cells to short time delays corresponding to fast memory cells, said range of different corresponding time delays being required due to different performance characteristics of said memory cells and said different performance characteristics being caused by at least one of process variations, temperature variations and voltage variations; and a delay signal generator receiving an input signal and delaying said input signal by a selected time delay within said long time delays so as to generate and output a delay signal that ensures functionality of at least some of said slow memory cells during said read operation, said delay signal generator comprising:

a second memory array comprising a plurality of second memory cells having a same design as said first memory cells such that said second memory cells similarly require said range of different corresponding time delays, said second memory cells each comprising at least one second transistor; and a reference voltage generator generating, for controlling said at least one second transistor, a second gate voltage that is less than said first gate voltage such that said input signal is delayed by said selected time delay.

9. The memory system of claim 8, said first memory cells and said second memory cells each comprising one of static random access memory (SRAM) cells, ternary content-addressable memory (TCAM) cells, dynamic random access memory (DRAM) cells, and non-volatile random access memory (NVRAM) cells.

10. The memory system of claim 8, said input signal comprising a clock signal having a clock transition that initiates said read operation.

11. The memory system of claim 8, said selected time delay being equal to that of a statistically $X\sigma$ slow memory cell and said second gate voltage being approximately equal to said first gate voltage minus a product of X and a $1\sigma$ threshold voltage (Vt) variation between first transistors across said first memory cells so as to achieve said selected time delay, wherein X is a number equal to one of two, three and four.

12. The memory system of claim 8, said second memory array outputting said delay signal.

13. The memory system of claim 8, said second memory array outputting a reference current and said delay signal generator further comprising delay circuitry that outputs said delay signal based on said reference current.

14. A memory system comprising:

a first memory array comprising a plurality of first memory cells, each first memory cell being identical in design and comprising at least one first transistor controlled by a first gate voltage, each first memory cell requiring a corresponding time delay between wordline activating and bitline sensing during a read operation, and said plurality of first memory cells requiring a range of different corresponding time delays between said wordline activating and said bitline sensing from long time delays corresponding to slow memory cells to short time delays corresponding to fast memory cells, said range of different corresponding time delays being required due to different performance characteristics of said memory cells and said different performance characteristics being caused by at least one of process variations, temperature variations and voltage variations; and a delay signal generator receiving an input signal and delaying said input signal by a selected time delay within said long time delays so as to generate and output a delay signal that ensures functionality of at least some of said slow memory cells during said read operation, said delay signal generator comprising:

a second memory array comprising a plurality of second memory cells having a same design as said first memory cells such that said second memory cells similarly require said range of different corresponding time delays, said second memory cells each comprising at least one second transistor; and a variable reference voltage generator adapted to selectively generate multiple different second gate voltages at a single node, said variable reference voltage generator generating, for controlling said at least one second transistor, a selected one of multiple different second gate voltage at said single node, said multiple different second gate voltage each being less than said first gate voltage, said selected one of said multiple different second gate voltages being preselected such that said input signal is delayed by said selected time delay.

15. The memory system of claim 14, said first memory cells and said second memory cells each comprising one of static random access memory (SRAM) cells, ternary content-addressable memory (TCAM) cells, dynamic random access memory (DRAM) cells, and non-volatile random access memory (NVRAM) cells.

16. The memory system of claim 14, said input signal comprising a clock transition that initiates said read operation.

17. The memory system of claim 14, said selected time delay being equal to that of a statistically $X\sigma$ slow memory cell and said second gate voltage being approximately equal to said first gate voltage minus a product of X and a $1\sigma$ threshold voltage (Vt) variation between first transistors across said first memory cells so as to achieve said selected time delay, wherein X is a number equal to one of two, three and four.

18. The memory system of claim 14, said second memory array outputting said delay signal.

19. The memory system of claim 14, said second memory array outputting a reference current and said delay signal generator further comprising delay circuitry that outputs said delay signal based on said reference current.

20. The memory system of claim 14, said variable reference voltage generator comprising a reference voltage output node and a plurality of transistors having different threshold voltages electrically connected to said reference voltage output node such that selective activation of said transistors having said different threshold voltages results in said selected one of said multiple possible second gate voltages at said reference voltage output node.

21. The memory system of claim 14, said variable reference voltage generator comprising:

a first voltage rail;

a second voltage rail;

a reference voltage generation circuit having a first node and a second node, said second node comprising a reference voltage output node;
a P-type transistor gating a positive power supply from said first voltage rail to said first node; and
an N-type transistor gating a negative power supply from said second voltage rail to said second node,
said reference voltage generation circuit further comprising a plurality of transistors having different threshold voltages electrically connected between said first node and said second node such that selective activation of said transistors results in said selected one of said multiple different second gate voltages at said reference voltage output node.

22. A method of operating a memory system, said method comprising:
receiving, by a delay signal generator of said memory system, an input signal;
delaying, by said delay signal generator, said input signal by a selected time delay so as to generate a delay signal; and
outputting, by said delay signal generator, said delay signal for timing of said memory system,
said memory system comprising a first memory array comprising a plurality of first memory cells, each first memory cell being identical in design and requiring a corresponding time delay between wordline activating and bitline sensing during a read operation, and said plurality of first memory cells requiring a range of different corresponding time delays between said wordline activating and said bitline sensing from long time delays corresponding to slow memory cells to short time delays corresponding to fast memory cells,
said range of different corresponding time delays being required due to different performance characteristics of said memory cells and said different performance characteristics being caused by at least one of process variations, temperature variations and voltage variations, and
said delaying being performed such that said selected time delay is within said long time delays corresponding to said slow memory cells so as to ensure functionality of at least some of said slow memory cells during said read operation.

23. The method of claim 22, said timing comprising any of wordline pulse timing and sense amplifier set signal timing and said receiving of said input signal comprising receiving a clock transition that initiates said read operation.

24. The method of claim 22,
said delay signal generator comprising a second memory array comprising a plurality of second memory cells having a same design as said first memory cells such that said second memory cells similarly require said range of different corresponding time delays,
said first memory cells each comprising at least one first transistor controlled by a first gate voltage,
said second memory cells each comprising at least one second transistor, and
said method further comprising controlling said at least one second transistor with a second gate voltage, which is less than said first gate voltage and which is predetermined such that said input signal is delayed by said selected time delay.

25. The method of claim 24, said delaying being performed such that said selected time delay is equal to that of a statistically Xσ slow memory cell and said second gate voltage being approximately equal to said first gate voltage minus a product of X and a 1σ threshold voltage (Vt) variation between first transistors across said first memory cells so as to achieve said selected time delay, wherein X is a number equal to one of two, three and four.

* * * * *